(12) United States Patent
Donato

(10) Patent No.: US 6,513,149 B1
(45) Date of Patent: Jan. 28, 2003

(54) ROUTING BALANCED CLOCK SIGNALS

(75) Inventor: John Joseph Donato, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/540,273

(22) Filed: Mar. 31, 2000

(51) Int. Cl.$^7$ .............................................. G06F 17/50
(52) U.S. Cl. ........................................ 716/12; 716/10
(58) Field of Search ...................... 716/12, 1–2, 5–18; 713/503; 375/356; 326/93; 257/208

(56) References Cited

U.S. PATENT DOCUMENTS

| | | | |
|---|---|---|---|
| 4,661,721 A | 4/1987 | Ushiku ........................ 307/269 |
| 4,692,932 A | 9/1987 | Denhez et al. ............... 375/107 |
| 4,769,558 A | 9/1988 | Bach ........................... 307/269 |
| 4,926,066 A | 5/1990 | Maini et al. .............. 307/303.1 |
| 5,239,215 A | 8/1993 | Yamaguchi .................. 307/480 |
| 5,391,942 A | 2/1995 | El-Ayat et al. ................. 326/39 |
| 5,397,943 A | 3/1995 | West et al. .................... 326/39 |
| 5,430,397 A | 7/1995 | Itoh et al. .................... 326/101 |
| 5,467,040 A | 11/1995 | Nelson et al. ............... 327/276 |
| 5,481,209 A | 1/1996 | Lim et al. ....................... 326/93 |
| 5,686,845 A | 11/1997 | Erdal et al. .................... 326/93 |
| 5,691,662 A | 11/1997 | Soboleski et al. ........... 327/292 |
| 5,717,229 A * | 2/1998 | Zhu ............................. 257/208 |
| 5,751,665 A | 5/1998 | Tanoi .......................... 368/120 |
| 5,774,371 A * | 6/1998 | Kawakami .................... 716/10 |
| 5,784,600 A * | 7/1998 | Doreswamy et al. ........ 713/503 |
| 5,818,263 A | 10/1998 | Ashuri .......................... 326/93 |
| 5,822,381 A * | 10/1998 | Parry et al. .................. 375/356 |
| 5,917,729 A * | 6/1999 | Naganuma et al. ............ 716/10 |
| 6,114,877 A * | 9/2000 | Brown et al. ................ 326/101 |
| 6,144,224 A * | 11/2000 | Lee et al. ...................... 326/93 |
| 6,266,803 B1 * | 7/2001 | Scherer et al. ................ 716/12 |
| 6,305,001 B1 * | 10/2001 | Graef ........................... 716/12 |

* cited by examiner

*Primary Examiner*—Matthew Smith
*Assistant Examiner*—Paul Dinh
(74) *Attorney, Agent, or Firm*—Carl M. Wright

(57) ABSTRACT

Clock paths are routed in two steps or phases. First, a local clock distribution network is generated to minimize as much as possible the length of conductors within regions and positioning local clock buffers, one in each region. Second, a global clock distribution network is designed to couple the local clock buffers to a clock source using equidistant conducting path between the local clock buffers. Consideration is given to constraints imposed by capacitance, conductor length, and power requirements. The second phase repeats the first phase when power constraints are violated.

9 Claims, 5 Drawing Sheets

ROUTING BALANCED CLOCK SIGNALS

BACKGROUND OF THE INVENTION

1. Field of the Invention

This invention relates to the layout of printed and integrated circuits and particularly to the routing of clock signals. More particularly, it relates to the distribution of clock signals in large integrated circuits.

2. Description of the Related Art

Large circuits such as Application Specific Integrated Circuits (ASIC) require the distribution of clock signals from a single clock driver source to each clocked element (sink). The skew, i.e., unequal delay times, of the clock from the source to the sinks has a deleterious effect on the performance of the entire circuit. Since large integrated circuits such as ASICs include numerous clocked elements, into the tens or even hundreds of thousands, it is important to design the clock circuitry so as to minimize the skew.

Due to the narrow width of conductors in large scale integrated circuits, a clock network must meet electromigration reliability rules. The clock network must be capable of being analyzed by using industry standards of extraction and analysis tools. Other factors impacting the design are implementation with industry standard circuit libraries and EDA (Engineering Design Automation) tools and low impact on the chip size and performance.

Prior art clock distribution networks sometimes use a package routing layer. The package routing layer usually has very little sheet resistivity so the clock signal can be distributed throughout the package. This approach is not available for those designs where the package does not include routing layers. It can also be costly to implement due to the routing customization of the specific application. This technique does not address the problems of local clock distribution.

"H" or "I" tree methods, a form of balanced routing to achieve low skew, depends on symmetric placement of clocked elements in the integrated circuit. Some applications may contain some regular structures that are symmetrical such as in a microprocessor, but VLSI applications are often asymmetrical. This prior art approach also uses wide "H" or "I" structures at the global level with increases power consumption and increases the complexity of the analysis.

Grid structures have the disadvantage of additional wiring to form the grid and larger power consumption. It requires a significant amount of wiring, especially when multiple clock domains must be driven which increases the chip size.

Methods which demand a large amount of wiring increase the net capacitance of the distribution and need additional power. The electromigration effect is increased with increases in power.

BRIEF SUMMARY OF THE INVENTION

This invention is a method of designing a low skew clock distribution system for circuit layouts containing clocked elements, especially very large scale integrated circuits (VLSI). Although it is applicable and useful in any circuit layout utilizing distributed signals, the description is especially applicable to VLSI and ASIC in particular. The faster the circuit elements, the more necessary a balanced clock distribution scheme.

The method disclosed maximizes VLSI performance due to the low skew. It also minimizes the development time and cost because it can be implemented with industry standard circuit libraries and EDA tools.

In accordance with the invention, local clock distribution networks are designated within regions in which a circuit layout is divided. Each local clock distribution network contains a local clock buffer which is coupled to the clocked circuit elements within the region by a minimum length path. A global clock distribution network is generated to couple the local clock buffers to the clock source by using serially connected buffers along equidistant paths.

BRIEF DESCRIPTION OF THE DRAWING

The invention is described in detail by referring to the various figures which illustrate specific embodiments of the invention, and wherein like numerals refer to like elements.

DETAILED DESCRIPTION OF THE INVENTION

Figure 1:
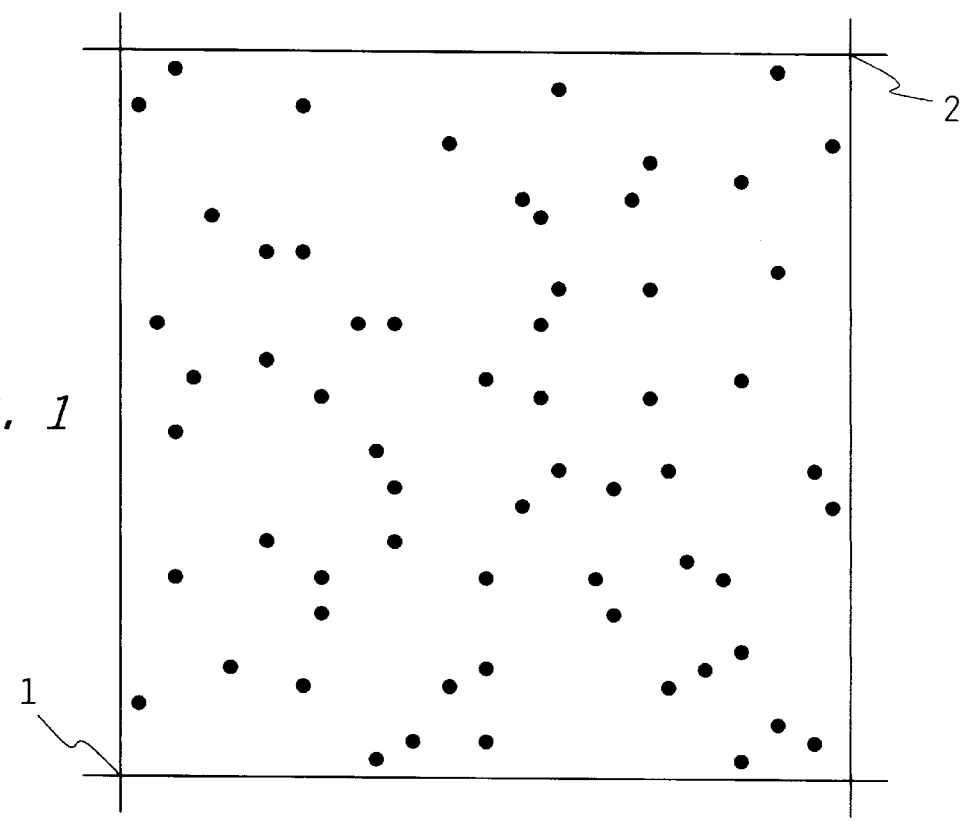
FIG. 1 is illustrative example of an integrated circuit layout showing a plurality of clock load locations.

The clock distribution network design is performed in two stages, both of which may be implemented after all the components have been positioned on the integrated circuit, including the clocked elements, and preferably prior to routing other signal conductors. First, a local clock distribution network is established followed by the generation of a global clock distribution network.

The end of the first stage is determined according to several factors including power constraints, area of the bounding box of all the sinks (clocked elements) in the local box, and considerations of wiring capacitance and resistance. Local Clock Distribution Networks Local clock distribution networks are implemented by grouping all the clock input pads or pins, into regions. Each region will include a local clock buffer network to drive the clock loads contained in the region. The clock delay of the buffer circuit in each region depends on factors including three components, the type of buffer used, the capacitive load at the output and the interconnect delay from a buffer to a clocked element. The skew is minimized within each region and between regions by matching these factors to each load, i.e., clocked element. This can be accomplished for two of the delay components by using dummy capacitive loads and the use of a single buffer type. The interconnect delay, $D_i$ is proportional to the RC time constant of the wiring, i.e., $D_i R_w(0.5C_w + C_{cl})$ where $R_w$ is resistance of the wire, $C_w$ is the capacitance of the wire, and $C_{cl}$ is the capacitance of the clock load.

The wire resistance is inversely proportional to its width and directly proportional to its length, $R_w L_w/W_w$. The capacitance of the wire is proportional to the product of its length and width, $C_w L_w W_w$. Therefore, $D_i 0.5L_w^2 + (L_w/W_w)C_{cl}$. By use of these relationships, the interconnect delays will be bounded by setting a maximum capacitive load on each buffer output.

To comport with electromigration rules of metal wiring layers, the current, width, operating conditions, and technological parameters must be taken into consideration. The maximum allowable capacitance can be found from the maximum allowable current, information which is provided in technology user guides.

Next, the maximum allowable interconnect delay is set. This value is set as low as possible taking into account the power required. A common design value is 2% of the cycle time.

To satisfy both conditions, $$C_{max} = \min \begin{cases} C_{em} \\ C_{dm} \end{cases} \quad (1)$$

where $C_{dm}$ is the capacitive load resulting in the maximum allowed interconnect delay. From $C_{dm}=C_w+C_{cl}$, $C_w=C_{dm}-C_{cl}$. With $C_w=K_1L_wW_w$ (where $K_1$ is a technological proportionality constant), $$L_w=(C_{dm}-C_{cl})/K_1W_w. \quad (2)$$

The resistance $R_w$, $L_w/W_w$ with the wire width remaining constant, $R_w=K_2(C_{dm}-C_{cl})$ where $K_2$ is another technological proportionality constant. The interconnect delay can now be represented by a combination of the above: $D_i$ 0.5$K_2$ $(C_{dm}-C_{cl})^2+K_2C_{cl}(C_{dm}-C_{cl})$. As $C_{cl}$ approaches 0, the interconnect delay approaches a maximum, and $C_{dm}$ can be derived. The value of $C_{max}$ is selected and the value used as a constraint when inserting the clock buffer in each region.

Figure 2:
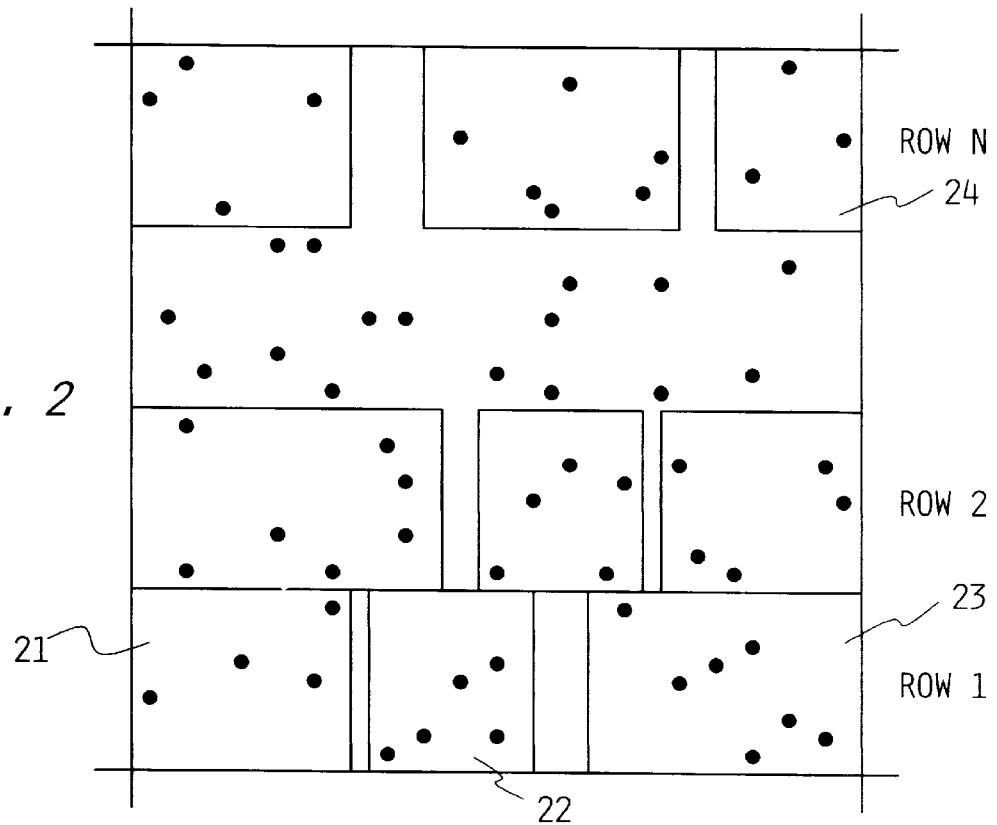
FIG. 2 is the layout of FIG. 1 with the layout of FIG. 1 divided into a plurality of regions.

The process for inserting the clock buffers begins by establishing the boundary of all the clock loads. An illustrative example is shown in FIG. 1. The box is bounded by $X_{min}$, $y_{min}$ in the lower left corner 1 and by $x_{max}$, $y_{max}$ in the upper right corner 2. Next, the box is divided into a plurality of rows of equal height as shown in FIG. 2. Each row is divided into regions 21, 22, and 23 up to the last region 24 in the box.

The rows are scanned by region, searching for the location of the clock loads from left to right. The clock load x,y locations are placed in an array together with the circuit type or the capacitance of the load. The capacitance data can be determined by table look-up using the circuit type as the criteria. This is performed for each region and the array data is used to determine a clock buffer for the related region.

The total net capacitance of the clock loads in a region is calculated using the data in its related array. It is determined from $C_{net}=C_w+C_{cl}$. The value of $C_w$ is based on the minimum Steiner length of the segments connecting the clock loads. The procedure for calculating minimum Steiner lengths is well known in the art or available in software routines.

A preferred technique is to calculate a running total of the net capacitance and continue the process so long as $C_{net} \leq C_{max}$. If $C_{net} > C_{max}$, the last clock load is removed from the array and the remaining clock loads assembled into other regions with their own arrays.

A clock buffer is located in each region and positioned in one of the steiner segments so as not to add additional wiring which would increase the net capacitance, $C_{net}$. Logic circuit changes can then be made to couple the clock loads in the region to the clock buffer.

The above procedure is repeated for each region along each row until all regions have a clock buffer. This method of inserting the local clock distribution networks is independent from the method of locating the clocked elements on the circuit layout which can be randomly placed. It is not essential to the method that the clocked elements be evenly distributed.

Figure 3:
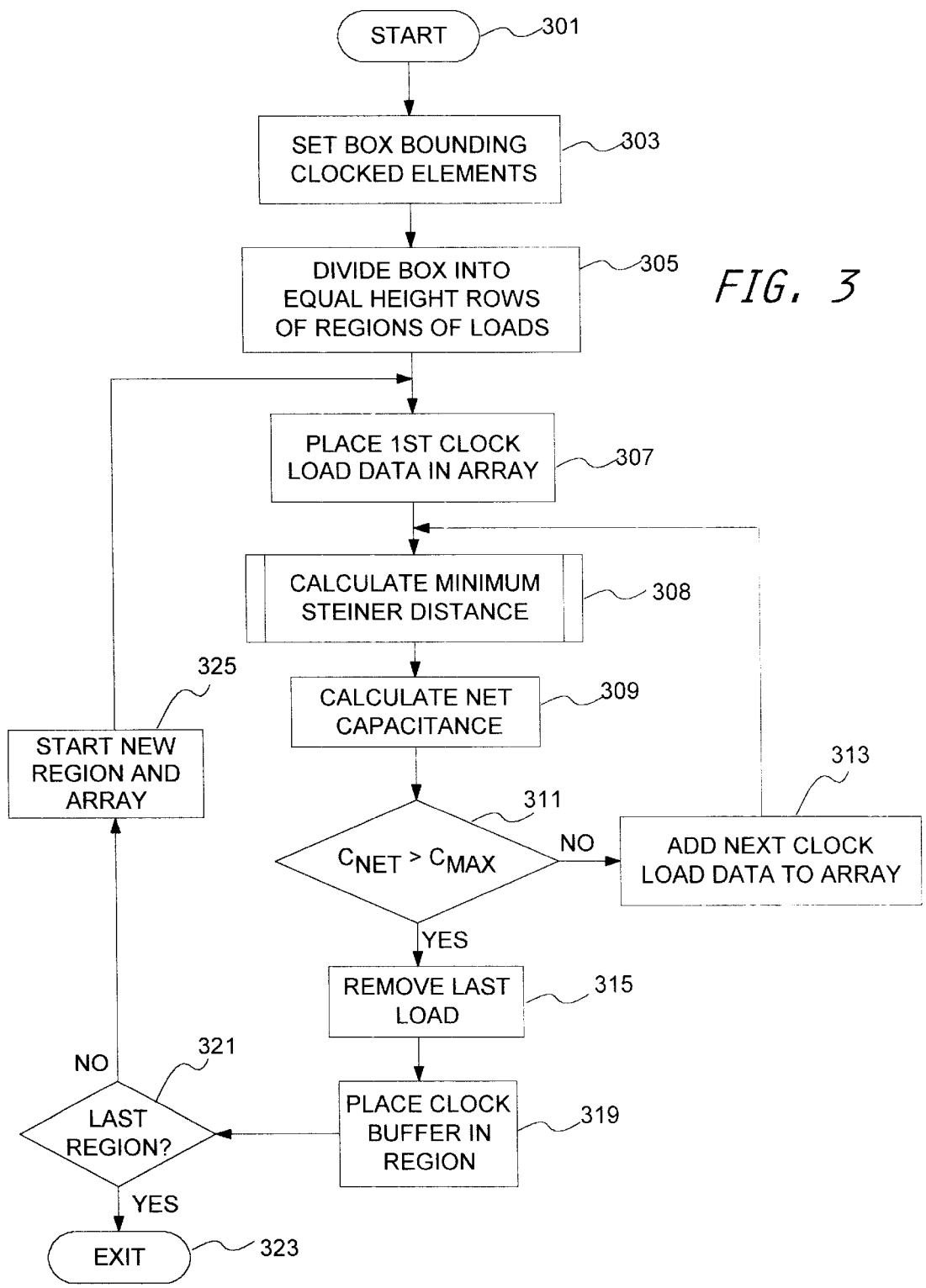
FIG. 3 is a flowchart of the process for routing a local distribution network.

The procedure described above for the first phase of generating local clock distribution networks is shown in FIG. 3. In the following description, references are made to the flowcharts depicting the sequence of operations performed by the program. The symbols used are standard flowchart symbols approved by the American National Standards Institute and the International Standards Organization. In the explanation, an operation may be described as being performed by a particular block in the flowchart. This is to be interpreted as meaning that the operations referred to are performed by programming and executing a sequence of instructions that produces the result said to be performed by the described block. The actual instructions used depend on the particular system employed to implement the invention. Different processors have different instruction sets but persons of ordinary skill in the art are familiar with the instruction sets with which they work and can implement the operations set forth in the blocks of the flowchart.

The process of FIG. 3 begins at a start terminal 301 and the boundaries of a box delineating the clocked elements to be driven are set by a process block 303. In a process block 305, the box is divided into rows of equal-height regions. Data for a first clock load is placed into an array by a process block 307. Next, a subroutine 308 calculates the minimum Steiner distance and the net capacitance of the clock loads in the array is calculated in a process block 309.

In a decision block 311, the net capacitance is compared to the maximum allowable predetermined capacitance. If the net capacitance exceeds the maximum, then the last load is removed from the array in a process block 315. Next, a clock buffer is placed in the region by a process block 319.

If the region just processed is the last region in the box as determined by a decision block 321, the procedure is exited via a terminal block 323. Otherwise, a process block 325 initializes a new array and a new region is processed by returning to the process block 307.

If the net capacitance in the array does not exceed the maximum predetermined capacitance at the decision block 311, then the next clock load data in the region is added to the array by a process block 313 and a return is made to the process block 308.

Figure 4:
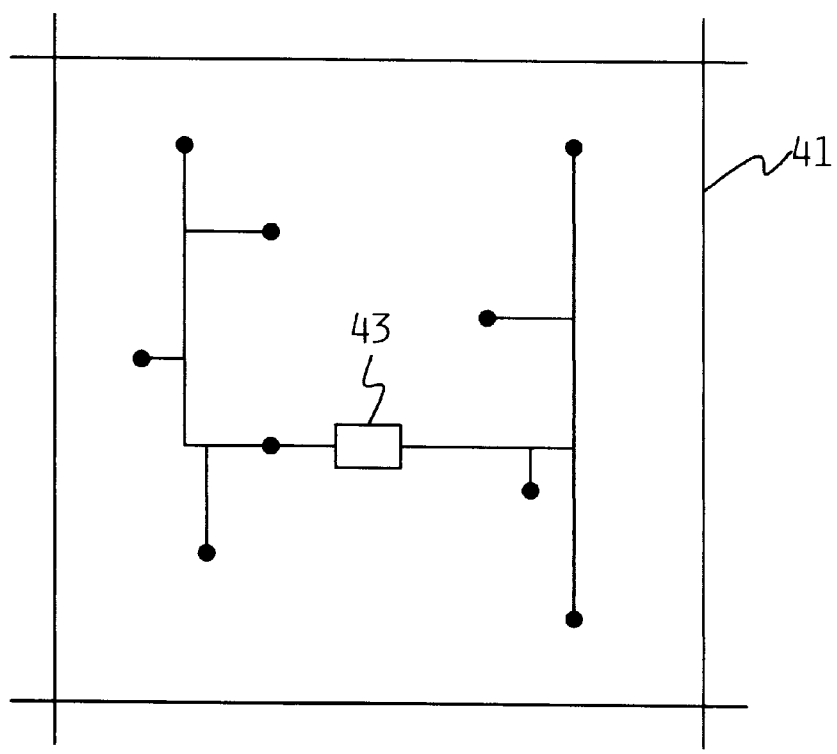
FIG. 4 is an illustration of an example of a region with a local clock network having clock loads connected by conductor lengths of minimum Steiner distances.

An example of a region with a local clock network is shown in FIG. 4. The region 41 has nine clock loads connected by a minimum length Steiner circuit path. A clock buffer 43 is positioned on a circuit so as not to require additional wiring, in this case in as central a position as possible to minimize the distance to all the clock loads.

Global Clock Distribution Network

The use of balanced length serial redrive segments by a global clock distribution network according to the invention minimizes or eliminates clock distribution skew. To accomplish this, a standard length is first defined with a concomitant power calculation. The process is comparable to the procedure for generating the local clock distribution network already described in that a maximum capacitance is first designated as in equation (1) above, but no skew is introduced into the global clock distribution network. Therefore, $C_{emax}$ is set to the maximum allowable capacitance according to the specifications in the technology electromigration rules.

Replacing the appropriate terms in equation (2) above and considering that the global clock distribution network will drive only clock buffer loads, $L_w=(C_{emax}-C_{bl})/K_1W_w$ where $C_{bl}$ is the clock buffer load capacitance.

Figure 5:
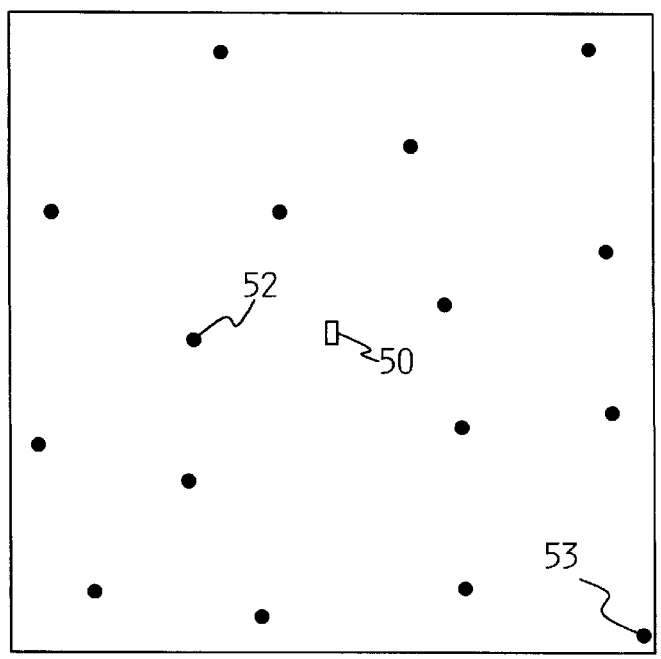
FIG. 5 is an illustrative example of a circuit showing the location of local clock buffers.

The substantially exact center of the box bounding the buffer circuits of the local network is determined. This center 50 is shown in FIG. 5, which shows the locations of the local clock buffers, and is referred to as $x_c, y_c$. Each of the clock buffer locations is compared to $x_c, y_c$. The clock buffer most distant from $x_c, y_c$ is denoted by $L_{max}$. In the illustrative example shown in FIG. 5, it is a local clock buffer 53. The distance is the Manhattan length, i.e., along paths parallel to the x- and y-axes. The clock buffer location 52 of FIG. 5 is the one at a minimum distance, $L_{min}$, from the center, $x_c, y_c$.

The number of redrive segments is defined as $$S = \max\left\{\frac{L_{max}^2}{L_w}\right\}.$$

That is, S is not less than two. The length of each redrive segment is then defined as $L_S = L_{max}/S$. The total capacitance of each segment is next calculated by $C_S = C_{bl} + K_1 W_w L_S$.

Next, the power calculation is made using the well-known formula $P = 0.5CV^2 f$. Therefore, if the global clock distribution network has to drive a total of z clock buffers, then $P = 0.5zSC_S V^2 f$. If the resulting power requirements exceed the circuit estimates, the local clock distribution network generation is repeated to force z sufficiently small to meet the total power estimate. This is accomplished by considering each of the z clock buffers as a clock load for the local clock distribution procedure.

The clock buffers of the global clock distribution network are then inserted into the design. For each of the z local clock buffers, S global buffers are added ad seriatim with as an exact distance of $L_S$ between the global buffers as possible. The exact distance can be a forced constraint. The insertion of the buffers is performed according to the following steps.:

(1) the location of one of the z local clock buffer circuits is selected.

Figure 6:
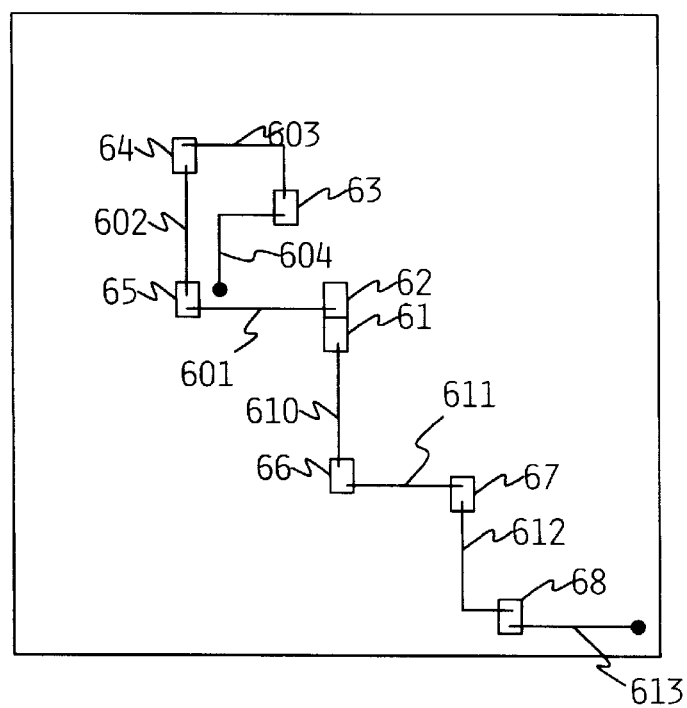
FIG. 6 is an illustration of the placing of global clock buffers on an example of a circuit.

(2) a global clock buffer circuit is placed at $x_c, y_c$. This is shown in FIG. 6 as a global clock buffer circuit 61. The output of this buffer is coupled to the input of the local clock buffer and the input is coupled to the clock source.

(3) insert another global clock buffer.

If this is the last global clock buffer circuit to be added for the selected local buffer, the S-th buffer, it is positioned at a distance $L_S$ from the selected local clock buffer and a distance of $L_S$ from the previously inserted global clock buffer, e.g., global clock buffers 68 and 63 in FIG. 6.

If this is not the last global clock buffer to be added, then it is placed at a distance $L_S$ from the previously inserted global clock buffer in the direction of the local clock buffer. For example, in FIG. 6, the global clock buffer 66 is placed a distance of $L_S$ from the global clock buffer 61 in a direction toward the local clock buffer 53. Another example is the global clock buffer 65 placed a distance of $L_S$ in the direction of the local clock buffer 52.

The outputs from these global clock buffers are coupled to the local clock buffers and their inputs are coupled to the outputs from the previously inserted global clock buffers.

(4) Repeat step (3) until S global clock buffers have been added for the selected local clock buffer.

(5) repeat step (2) through (4) for the next local clock buffer. The other global clock buffers 63, 64, 67, and 68 are positioned the same way.

As a result of performing the above steps, the delay path from the clock source to any of the local clock distribution networks is equal. As shown in FIG. 6, although local clock buffer 52 is close to the center $x_C, y_c$ and local clock buffer 53 is far from the center $x_c, y_c$, the delay in the path to local clock buffer 52, the sum of path lengths S10, S11, S12, and S13, is equal to the delay in the path to local clock buffer 53, the sum of path lengths S00, S01, S02, and S03.

It has been presumed that the capacitance and resistance of the horizontal and vertical clock routing layers are equal, a usually valid presumption. If not, then the lengths of the x and y legs of the clock paths can be made equal for each path leg. This and other modifications such as revisions to the equations to take into account the different capacitances of vertical and horizontal clock routing layers is within the skill of the art given the teachings of the invention.

Figure 7:
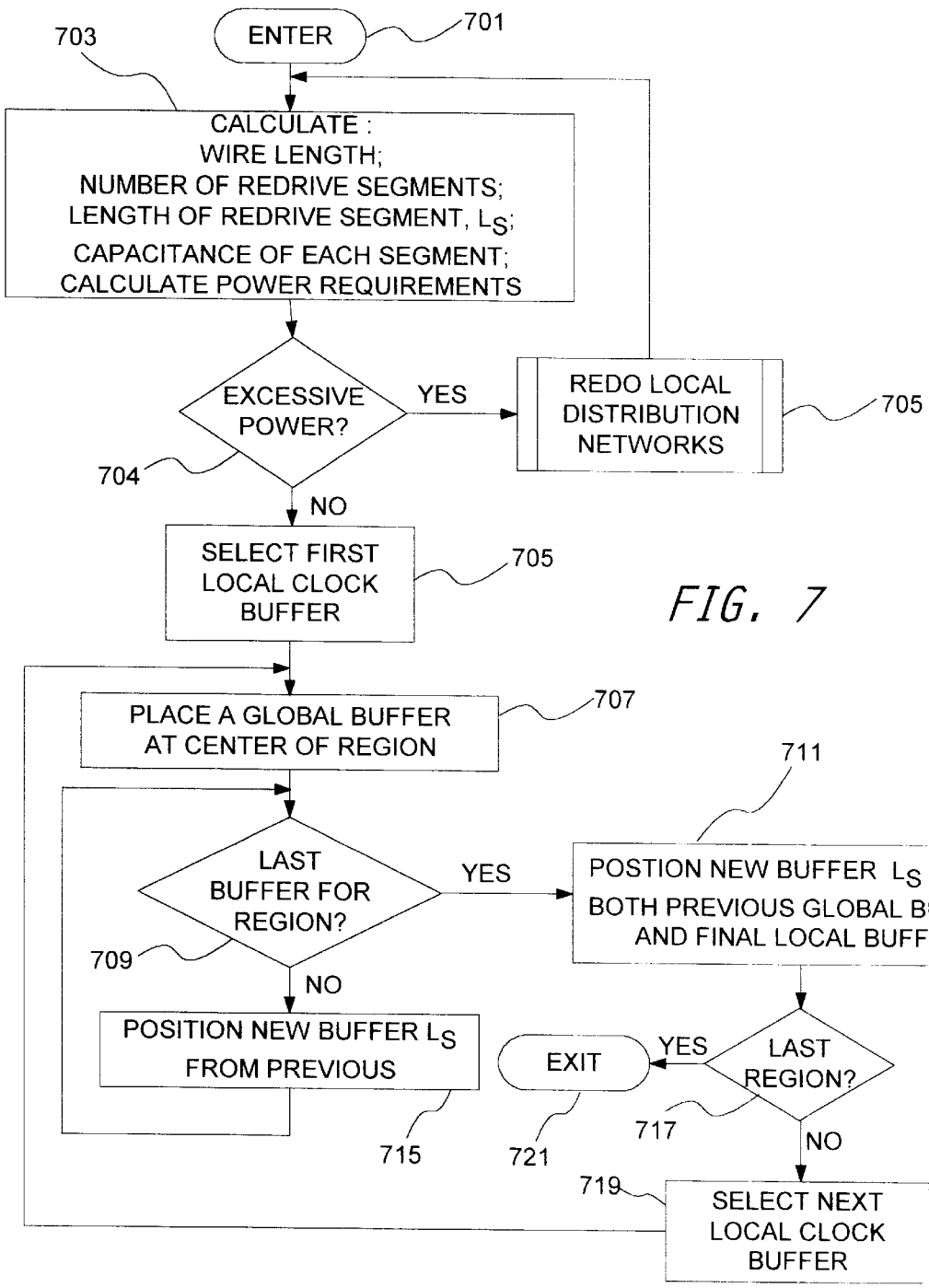
FIG. 7 is a flowchart of the procedure for positioning global clock buffers.

FIG. 7 is a flowchart showing the procedure for positioning global clock buffers. The procedure begins at a terminal 701 followed by a process block 703 in which the parameters described above are calculated.

In a decision block 704, excess power requirements call the local clock distribution network procedure of FIG. 3 to generate a new local clock distribution network which will drive the existing local clock distribution network. Then control returns to the process block 703 for a recalculation of the parameters.

If the power requirements are not excessive, then a process block 705 selects a first local clock buffer. A process block 707 positions a global clock buffer at the center of the region. A decision block 709 determines whether this is the last buffer for the region. If not, then a global clock buffer is positioned the $L_S$ distance from the previously inserted global clock buffer in a process block 715 and the decision block 709 determines whether it is the last global clock buffer for the region. If it is the last global clock buffer for the region, then a process block 711 positions a global clock buffer at a position equidistant between the previously inserted global clock buffer and the last local clock buffer so that it is a distance of $L_S$ from both.

A decision block 717 determines whether it is the last local clock buffer and if it is, the procedure is exited via a terminal block 721. If not, then a process block 719 selects the next local clock buffer and a return is made to the process block 707 to place the global clock buffers for the selected local clock buffer as described above.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. A method of routing clock signals to clock loads on a circuit layout comprising the steps of:

generating local clock distribution networks in defined regions of a circuit layout, each network including a local clock buffer;

generating global clock distribution networks connecting the local clock buffers to a clock source with conductors of approximately equal lengths; the step of generating local clock distribution networks including steps of:

grouping clock loads within the circuit layout into regions;

defining conductors of the networks to connect clock loads of each region to a local clock buffer;

calculating a maximum circuit parameter based on electromigration rules of metal wire layers;

entering data representing each clock load within a region into an array; and processing array data after entering data for each clock load to ascertain whether the maximum circuit parameter has been exceeded.

2. The method of claim 1 further including a further step of:

rearranging regions including numbers of clock loads which cause the maximum circuit parameter to be exceeded until the maximum circuit parameters are not exceeded.

3. The method of claim 1 wherein said defining step includes the additional step of:

determining a total length of conductor paths within each region as substantially minimum.

4. The method of claim 3 including the step of:

placing on each conductor path within a region a local clock buffer.

5. A machine implemented process for routing clock signals in circuit layouts to minimize clock skew comprising the steps of:

designating a path of conductors between clock loads in regions of the circuit layout to couple clocked circuit elements to a local clock buffer;.

specifying a path of conductors to couple global clock buffers to the local clock buffers; the designating step including steps of:

defining bounded areas enclosing all the clocked elements in the circuit;

dividing a bounded area into rows of regions;

positioning local clock buffers within each region; the positioning step including steps of calculating minimum length paths for successive local clock buffers;

determining whether a path connecting a plurality of clocked circuit elements exceeds predetermined parameters; and continuing to add successive clocked circuit elements to a local clock buffer so long as the predetermined parameters are not exceeded.

6. The machine implemented process of claim 5 wherein the specifying steps includes steps of:

defining paths of conductors coupling global clock buffers in serial fashion; and positioning global clock buffers so that the lengths of paths of conductors coupling them are approximately constant.

7. The machine implemented process of claim 6 including an initial step of: locating a first global clock buffer in approximately the center of a bounded area.

8. The machine implemented process of claim 7 including steps of:

assessing power requirements of a global clock buffer when positioned; and re-executing the designating step if power requirements are excessive.

9. The machine implemented process of claim 8 wherein the re-executing step includes a step of:

reducing the number of regions in the dividing step.

* * * * *